(12) United States Patent
Chiu et al.

(10) Patent No.: US 6,950,901 B2
(45) Date of Patent: Sep. 27, 2005

(54) METHOD AND APPARATUS FOR SUPPORTING PARITY PROTECTION IN A RAID CLUSTERED ENVIRONMENT

(75) Inventors: Lawrence Yium-Chee Chiu, Cupertino, CA (US); Windsor Wee Sun Hsu, Sunnyvale, CA (US); Honesty Cheng Young, Saratoga, CA (US)

(73) Assignee: International Business Machines Corporation, Armonk, NY (US)

( * ) Notice: Subject to any disclaimer, the term of this patent is extended or adjusted under 35 U.S.C. 154(b) by 525 days.

(21) Appl. No.: 09/755,858

(22) Filed: Jan. 5, 2001

(65) Prior Publication Data

US 2002/0091897 A1 Jul. 11, 2002

(51) Int. Cl.[7] .............................. G06F 12/00; G06F 9/00
(52) U.S. Cl. ........................ 711/114; 711/163; 714/6; 714/800
(58) Field of Search ................................. 711/114, 112, 711/147, 150, 151, 152, 154, 163, 164; 714/6, 11, 12, 769–771, 800–805

(56) References Cited

U.S. PATENT DOCUMENTS

| | | |
|---|---|---|
| 4,604,694 A | 8/1986 | Hough |
| 4,864,559 A | 9/1989 | Perlman |
| 5,243,596 A | 9/1993 | Port et al. |
| 5,263,161 A | 11/1993 | Barth et al. |
| 5,280,612 A | 1/1994 | Lorie |
| 5,339,443 A | 8/1994 | Lockwood |
| 5,392,433 A | 2/1995 | Hammersley et al. |
| 5,450,600 A * | 9/1995 | Abe ............................ 717/114 |
| 5,463,733 A | 10/1995 | Forman et al. |
| 5,502,840 A | 3/1996 | Barton |
| 5,513,354 A | 4/1996 | Dwork et al. |
| 5,530,948 A * | 6/1996 | Islam ............................. 714/6 |
| 5,574,882 A * | 11/1996 | Menon ........................ 395/441 |
| 5,577,261 A | 11/1996 | Harinarayan et al. |
| 5,623,670 A | 4/1997 | Bohannon et al. |
| 5,630,140 A | 5/1997 | Modiri et al. |
| 5,682,470 A | 10/1997 | Dwork et al. |
| 5,729,749 A | 3/1998 | Ito |
| 5,892,955 A * | 4/1999 | Ofer ............................. 395/726 |
| 6,101,615 A * | 8/2000 | Lyons ............................. 714/6 |
| 6,105,099 A | 8/2000 | Freitas et al. |
| 6,219,751 B1 * | 4/2001 | Hodges ........................ 711/114 |

OTHER PUBLICATIONS

Schimmel, UNIX Systems for Modern Architectures Symmetric Multiprocessing and Caching for Kernel Programmers. 1994, Corporate & Professional Publishing Group, pp. 155–160.*

IBM Technical Disclosure Bulletin, "Limited Distributed DASD Checksum", Sep. 1992, vol. No. 35, Issue No. 4A, pp. 404–405.*

(Continued)

*Primary Examiner*—Kimberly McLean-Mayo
(74) *Attorney, Agent, or Firm*—Gates & Cooper LLP

(57) ABSTRACT

The present invention discloses a method, apparatus, and article of manufacture for implementing a locking structure for supporting parity protection in a RAID clustered environment. When updating parity, the parity is locked so that other nodes cannot access or modify the parity. Accordingly, the parity is locked, read, generated, written, and unlocked by a node. An enhanced protocal may combine the lock and read functions and the write and unlock functions. Further, the SCSI RESERVE and RELEASE commands may be utlized to lock/unlock the parity data. By locking the parity in this maner, overhead is mininized and does not increase as the number of nodes increases.

21 Claims, 3 Drawing Sheets

OTHER PUBLICATIONS

R.J. Anderson et al., "Wait–free Parallel Algorithms for the Union–Find Problem," Proceedings 23, ACM STOC, 1991, pp. 370–380.

Bernstein et al., "Concurrency Control and Recovery in Database Systems," Chapters 7.3–7.4, pp. 222–240.

T.D. Chandra et al., "On the Impossibility of Group Membership," ACM 1996, p. 322.

T.D. Chandra, "Polylog Randomized Wait–Free Consensus," Proceedings of $15^{th}$ ACM Symposium on Principles of Distributed Computing, 1996, pp. 166–175.

T.D. Chandra et al., "Unreliable Failure Detectors for Asynchronous Systems," Proceedings of $10^{th}$ ACM Symposium on Principles of Distributed Computing, 1991, pp. 325–340.

S. Chaudhuri et al., "Understanding the Set Consensus Partial Order Using the Borowsky–Gafni Simulation," Proceedings of $10^{th}$ International Workshop on Distributed Algorithms, Italy, 1996, pp. 362–379.

D. Dolev, "A Framework for Partitionable Membership Service," 1996, ACM, 10 pgs.

I. Keidar et al., "Efficient Message Ordering in Dynamic Networks," Proceedings, $15^{th}$ Annual ACM Symposium on Principles of Distributed Computing, 1996, pp. 68–76.

C. Dwork, "Collective Consistency," LN in CS 1151 WDAG Proceedings, 1996, p. 234.

C. Dwork, "Collective Consistency (Work in Progress)," ACM 1996, p. 341.

F. Jahanian et al., "Processor Group Membership Protocols: Specification, Design and Implementation," $12^{th}$ Symposium on Reliable Distributed Systems, Oct. 1993, pp. 1–11.

B. Hajek et al., "The Time Complexity of Maximum Matching by Simulated Annealing," 1988, Journal of the Association for Computing Machinery, 35(2):387–403.

B.W. Lampson, "How to Build a Highly Available System Using Consensus," $19^{th}$ International Workshop—Distributed Algorithms, Italy, 1996, pp. 1–17.

G. Neiger, "A New Look at Membership Services," ACM 1996, p. 331.

J.D. Palmer et al., Method and Apparatus for Ordered Reliable Multicast with Asymmetric Safety in a Multiprocessing System, U.S. Appl. No. 08/972,111 filed Nov. 17, 1997, pp. 1–42.

A. Ricciardi, "Impossibility of (Repeated) Reliable Broadcast," ACM 1996, p. 342.

D.A. Patterson et al., 1988, "A Case for Redundant Arrays . . . (RAID)," ACM, pp. 109–116.

TechWeb, TechEncyclopedia, RAID, Jul. 19, 2000, 7 pages.

IBM Disk Storage Systems, "SCSI Command Reference 2105 Model B09," 1998, 119 pages.

* cited by examiner

METHOD AND APPARATUS FOR SUPPORTING PARITY PROTECTION IN A RAID CLUSTERED ENVIRONMENT

CROSS-REFERENCE TO RELATED APPLICATIONS

This application is related to the following co-pending and commonly assigned patent application, which application is incorporated by reference herein:

U.S. patent application Ser. No. 09/203,101, entitled "Method for Managing Concurrent Processes Using Dual Locking", by Richard Francis Freitas, et. al., filed on Nov. 30, 1998.

BACKGROUND OF THE INVENTION

1. Field of the Invention

The present invention relates to data storage systems, and in particular, to a method and apparatus for supporting parity protected RAID in a clustered environment.

2. Description of the Related Art

The ability to manage massive amounts of information in large scale databases has become of increasing importance in recent years. As businesses begin to rely more heavily on large scale database management systems, the consequences of hardware-related data losses intensify, and the security, reliability, and availability of those systems becomes paramount.

One way to increase the reliability and availability of data stored in large databases is to employ a technology known as a redundant array of inexpensive/independent disks, or RAID. This technique is described in the paper "A Case for Redundant Array of Inexpensive Disks (RAID)," by David A. Patterson, Garth Gibson, and Randy H. Katz, and given at the *A CM Sigmiod Conference* 1988, pages 109–116 (1988), which is herein incorporated by reference.

One or more RAID systems provide for fault tolerance using parity. Parity calculates the data in two drives and stores the result (a bit from drive 1 is XOR'd with a bit from drive 2, and the result is stored). Accordingly, parity is the XOR of member data and if data is dropped (e.g., if a disk dies), the data can be recovered by the using parity.

At least five RAID "levels" have been defined. RAID-0 writes/interleaves data across the drives in the array, one segment at a time. This is also referred to as a "striped" configuration. Striping offers high I/O rates since read and write operations may be performed simultaneously on multiple drives. RAID-0 does not increase reliability, since it does not provide for additional redundancy.

RAID-1 writes data to two drives simultaneously. If one drive fails, data can still be retrieved from the other member of the RAID set. This technique is also known as "mirroring." Mirroring is the most expensive RAID option, because it doubles the number of disks required, but it offers high reliability. Additionally, the cost ratio of fault tolerant storage is high.

In RAID-2, each bit (rather than bytes or groups of bytes) of a data word is interleaved/written across the drives in the array. Hamming error correcting code (ECC) is recorded on an ECC disk When the data is read, the ECC verifies the correct data or corrects single disk errors.

In RAID-3, the data block is striped and interleaved/written across the disks in the array. Parity bits (also referred to as stripe parity) is generated when data is written to the disks, recorded on a separate dedicated parity disk, and checked on read operations. RAID-3 provides high read and write transfer rates, and a low ratio of parity disks, but can yield a transaction rate that does not exceed that of a single disk drive. The controller implementing a RAID-3 array maybe implemented in hardware or software. Software RAID-3 controllers are difficult to implement, and hardware RAID-3 controllers are generally of medium complexity.

In RAID-4, each entire data block is written on a data disk Parity for blocks of the same rank are generated for data writes and recorded on a separate dedicated parity disk The parity data is checked on read operations. RAID-4 provides a high read data transaction rate, but can require a complex controller design. RAID-4 arrays generally have a low write transaction rate and it can be difficult to rebuild data in the event of a disk failure.

In RAID-5, each data block is striped across the data disks in the array. Parity for blocks in the same rank is generated on write operations, and recorded in locations distributed among the disks in the array. Parity is checked during read operations. RAID-5 is similar to RAID-3, except that the parity data is spread across all drives in the array. RAID-5 offers high read transaction rates. Disk failures can compromise throughput, however, and RAID-5 controllers can be difficult to implement.

An additional RAID level is RAID-6 which is similar to RAID-5 but two different parity computations or the same computation is performed on overlapping subsets of the data. RAID-6 has the highest reliability, but is not widely used due to the difficulty in implementation and double parity computations.

When shared parity protected RAID data (e.g., RAID-4 data, RAID-5 data, RAID-6 data, and their variations) is supported by multiple nodes (either with RAID adapters or software RAID) in a cluster, the RAID parity update may be incorrect when two or more nodes change different data items in the same RAID stripe at about the same time. In other words, when there is more than one master managing the storage array in a RAID, there can be problems. Data integrity may be lost if updates to panty are not synchronized properly. Cache memory holds the data between adapters and disks, including parity data. Further, cache memory is usually used in a RAID-5 controller to improve write performance by capturing all the data needed for a stride write.

For example, suppose D0 and D1 are two distinct data items in the same RAID-5 stripe and they are protected by the same parity P. Node N0 updates D0 and P; node N1 updates D1 and P. In order to update P, both N0 and N1 need to read and write P. The operations are referred to as R0/W0 and R1/W1 for the parity read/write operations performed by N0 and N1, respectively. Depending on the order R0, W0, R1, and W1 are performed, the result may be incorrect. For example, if the order is R0, R1, W0, W1, the parity does not include D0 changes, hence, is incorrect.

One prior art solution used for ensuring and synchronizing parity update is for each participating node to maintain lock information on the other adapters/nodes. Such a solution is more fully described in co-pending U.S. patent application Ser. No. 09/127,472, entitled "Disk Arrays Using Non-Standard Sector Sizes", by Jaishankar M. Menon, et. al., Attorney Docket No. AM9-98-025, filed on Jul. 31, 1998, which application is hereby fully incorporated by reference herein. However, when the number of nodes increases, each node must maintain the lock information which grows with the number of nodes. Consequently, such a solution does not scale well with a larger number of nodes, and cannot handle the addition or deletion of nodes gracefully. Further, to maintain such lock information on participating nodes, the nodes must maintain the ability to communicate with each other. For example, in the prior art, SSA (serial storage architecture) RAID adapters comprise two (and only two) adapters communicating to a disk and with each other via a separate communications channel. However, in small computer system interface (SCSI) systems (a system commonly utilized in RAID systems), such inter-adapter communication does not exist in a non-proprietary way.

Accordingly, what is needed is a storage system and method for managing and updating the parity for RAID data in a SCSI system that scales well for a large number of nodes and handles node addition/deletion gracefully.

SUMMARY OF THE INVENTION

To address the requirements described above, the present invention discloses a method, apparatus, article of manufacture, and a locking structure for supporting parity protected RAID in a clustered environment. When updating parity, the parity is locked so that other nodes cannot access or modify the parity. Accordingly, the parity is locked, read, generated, written, and unlocked by a node. An enhanced protocol may combine the lock and read functions and the write and unlock functions. Further, the SCSI RESERVE/PERSISTENT RESERVE and RELEASE commands may be utilized to lock/unlock the parity data. By locking the parity in this manner, overhead is minimized and does not increase as the number of nodes increases.

BRIEF DESCRIPTION OF THE DRAWINGS

Referring now to the drawings in which like reference numbers represent corresponding parts throughout.

DETAILED DESCRIPTION OF PREFERRED EMBODIMENT

Figure 1:
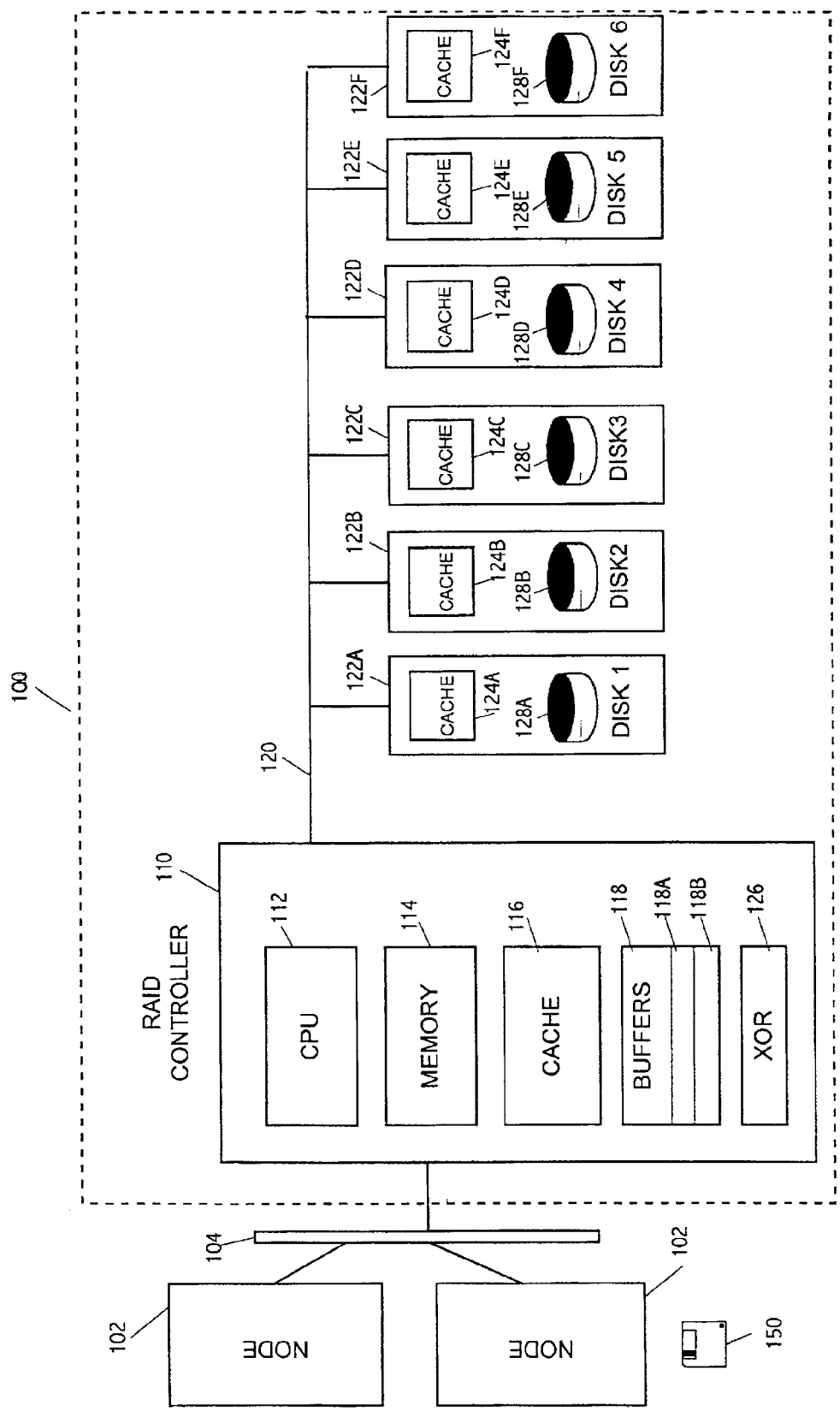
FIG. 1 is a block diagram of a host computer coupled to a RAID array.

In the following description, reference is made to the accompanying drawings which form a part hereof, and which is shown, by way of illustration, several embodiments of the present invention. It is understood that other embodiments may be utilized and structural changes may be made without departing from the scope of the present invention.
Hardware Environment FIG. 1 is a block diagram showing a hardware environment implementing one embodiment of the present invention. A RAID array 100 accepts commands from one or more nodes 100–102 (such as a host computer, another RAID array, or a disk 128 in a RAID array) via an interconnecting bus 104. These commands comprise, interalia, commands to write data to the RAID array 100 and commands to read data from the RAID array 100. Ordinarily, the smallest unit of data that can be written to and read from the RAID array 100 is one user sector, typically 512 bytes. One or more nodes 100–102 could be interconnected with the RAID array 100, and to other RAID arrays 100 and other devices via a local area network, wide area network internet, or other means of providing communications.

A node 100–102, and 128 may accept a program storage device 150 that tangibly embodies program steps to perform processor instructions. The program storage device can include a CD-ROM, read/writeable CD-ROM, floppy disk, tape drive, magneto-optical storage apparatus, or similar device. Further, the program steps may be executed from within an application that is stored on one of the above-identified devices and may be transmitted or downloaded across an interconnecting bus or network 104. Additionally, such an application may be stored in host computer 102, in RAID array 100, within RAID controller 110, or other similar device. Alternatively, the program steps may comprise hardware or electronic circuitry located within RAID controller 110, host computer 102, RAID array 100, or other similar device.

The RAID array 100 comprises a RAID controller 110 communicatively coupled to a plurality of storage units 122A, 122B, 122C, 122D, 122E, and 122F (hereinafter collectively referred to as storage units 122). Typically, these units are independent inexpensive hard drives, but the subject invention can be practiced with a wide variety of read/writeable storage devices. The RAID controller 110 I/O module writes to, reads from, and recovers data from storage units 122. This functionality can be implemented in RAID controller 110 hardware, or can be implemented by a RAID controller CPU 112, using instructions stored in the memory RAID controller memory 114. RAID functionality can also be implemented in the host computer 102. The RAID controller 110 also includes a cache 116 for temporarily storing data to be written to or read from the storage units, a plurality of buffers 118, including first buffer 118A and second buffer 118B, and an EXCLUSIVE OR (XOR) unit 126 for performing parity calculations in accordance with RAID techniques. Although the EXCLUSIVE OR unit 126 and buffers 118 are depicted as a part of the RAID controller 110, the present invention may also be practiced by implementing an EXCLUSIVE OR unit 126, and/or buffers 118 in each data storage device 122.

Each storage unit 122 comprises media device 128 such as a hard disk, and a storage unit cache 124 for temporarily storing data for rapid storage and retrieval. The media device can include a magnetic hard disk, a magneto-optical storage device, a CD-ROM, read/writeable CD-ROM, tape drive, or similar device.
Process One or more embodiments of the invention ensure that only one device is in charge of parity updating at a given time. Only the device can update parity at any given time. Further, ownership is floating, temporary, and short, such that the ownership of parity is obtained, the parity is updated, and the ownership of the parity is released.

To accomplish these tasks and synchronize and maintain parity amongst multiple nodes, one or more embodiments of the invention lock parity data. When a node desires to update parity, the node (e.g., the application or hardware that is updating the parity) locks the parity data without communicating with other nodes. Since the node does not need to communicate with other nodes, the node scales with a large number of nodes (e.g., disks) and nodes can be added to or removed from the cluster easily. In a shared disk cluster environment, SCSI over Fibre Channel, SCSI on Infiniband, or SCSI on IP network may be the protocol utilized. In a SCSI over Fibre Channel system, existing RESERVE and RELEASE commands may be utilized to lock and unlock the parity (see detailed description below).

Figure 2:
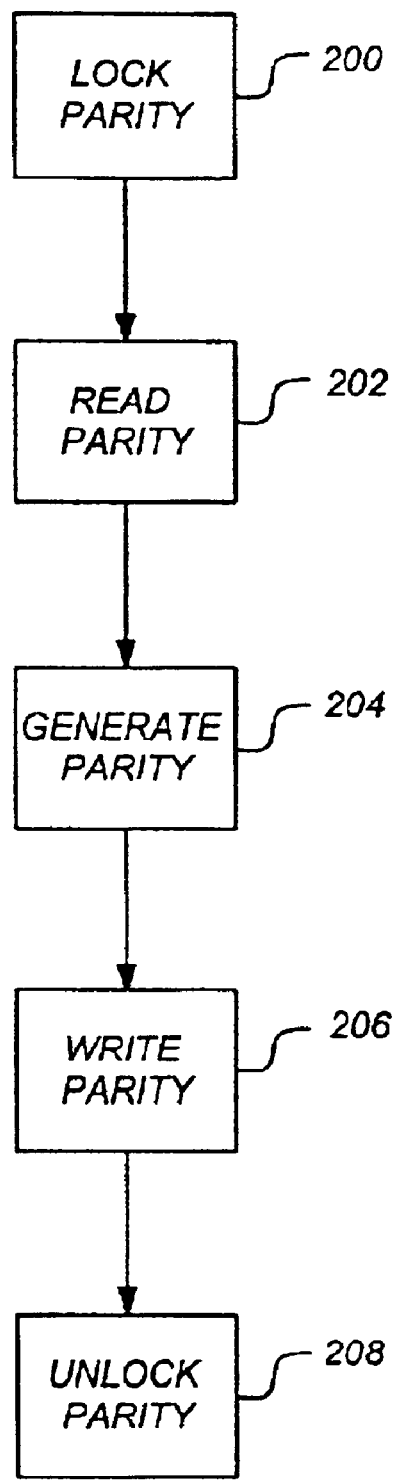
FIG. 2 is a flow chart illustrating the protocol for locking parity data in accordance with one or more embodiments of the invention.

FIG. 2 is a flow chart illustrating the protocol for locking parity data in accordance with one or more embodiments of the invention. At step 200, the parity is locked. At step 202, the existing parity is read. At step 204, the new parity is generated by EXCLUSIVE ORing the data from two nodes. At step 206, the parity is written to the appropriate stripe. At step 208, the parity is unlocked. Assuming that inter-node communication and node-disk communication have about the same overhead, the invention has no more overhead than the prior art method for a two-node cluster. The overhead of the invention, however, does not increase with the number of nodes in the cluster. Thus, the overhead is smaller than other methods for a cluster with three or more nodes.

Figure 3:
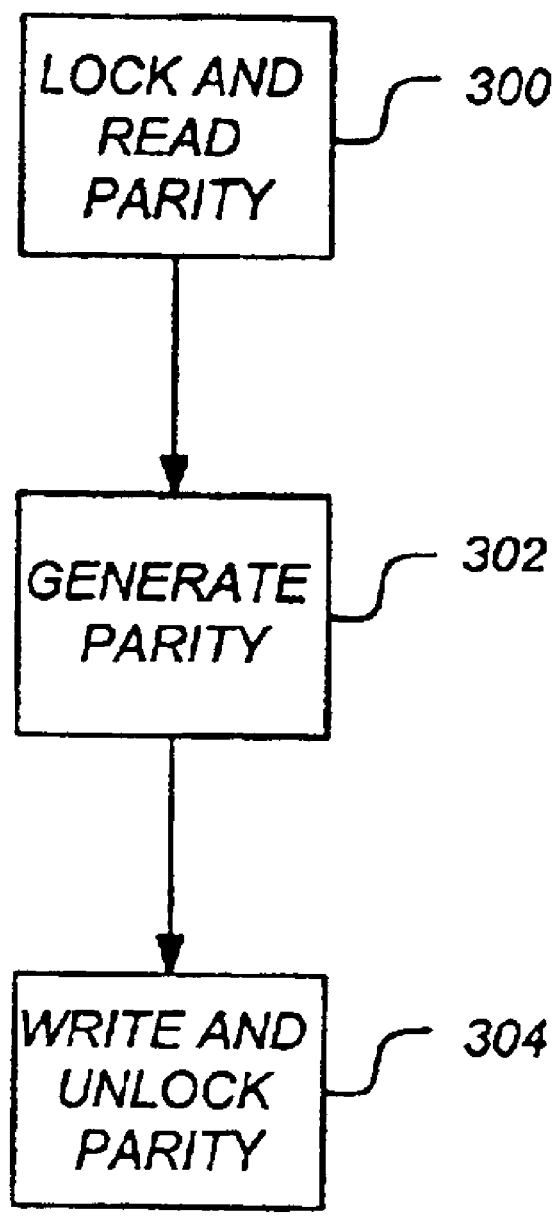
FIG. 3 illustrates a flow chart using an enhanced protocol in accordance with one or more embodiments of the invention.

The protocol described in FIG. 2 may be enhanced such that the invention has less overhead than other methods for any number of nodes in a cluster. In an enhanced protocol, step 200 and step 202 are combined, and step 206 and 208 are combined. FIG. 3 illustrates a flow chart using an enhanced protocol in accordance with one or more embodiments of the invention. At step 300, the parity is locked and read (steps 200 and 202 of the original procedure/protocol). At step 302, the parity is generated (step 204 of the original procedure/protocol). However, parity regeneration may only be used for I/O when one disk 128 fails. At step 304, the parity is written in the appropriate stripe and unlocked (steps 206 and 208 of the original procedure/protocol).

The adapters used to perform the above-described tasks need not be the same and can be heterogeneous. Further, to accomplish the locking and unlocking of steps 200, 208, 300, and 304, with SCSI data storage devices 128, the RESERVE and RELEASE commands currently available in the SCSI protocol command set may be utilized. Since the RESERVE/RELEASE commands do not require mechanical movement, they are very efficient and the locking is not needed to conduct a full RAID-5 stripe update. The RESERVE command is used to reserve an entire logical unit (e.g., an entire disk 128 containing the parity data to be updated) for the initiator of the command (i.e., the node/user locking the parity. Using the RESERVE and RELEASE commands, once the logical unit containing the parity data is reserved, the reservation exists until one of the following conditions is satisfied: (1) the initiator of the RESERVE command issues another RESERVE command for the same logical unit; (2) the initiator of the RESERVE command issues a RELEASE command (see below); (3) the logical unit is reset by a LUN (logical unit number) (i.e., parity identification) reset message, a target reset message, or a hard reset; or (4) a power off/on cycle occurs.

The RELEASE command is used to release a previously reserved logical unit (i.e., the disk 128 that contains the parity data). Only the initiator that issued the RESERVE command for a logical unit may release the logical unit. The RESERVE and RELEASE commands are more fully described in "SCSI Command Reference 2105 Model B09 Release 1" by International Business Machines Corporation, August 1998, which is hereby fully incorporated by reference herein.

In addition to the RESERVE and RELEASE command currently available in the SCSI protocol, any other methods, protocols, or systems for locking the parity data may be utilized. For example, the sector, word, cylinder, byte, bit, etc. containing the relevant parity data may be locked and unlocked to provide the functionality in accordance with one or more embodiments of the invention.

CONCLUSION

This concludes the description of the preferred embodiments of the present invention. In summary, the present invention describes a method, apparatus, article of manufacture, and a memory structure for maintaining in a cluster environment the lock of a RAID parity with the parity itself. Additionally, SCSI's RESERVE/RELEASE commands may be utilized to lock/unlock the parity. A protocol enhancement combines the lock and read of parity, and write and unlock of parity. With the enhanced protocol, the overhead for ensuring accurate parity is minimized, flexible and does not increase with additional nodes.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto. The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A method of updating parity data in a redundant array of independent disk (RAID) clustered environment comprising:
   (a) locking purity data, without communicating with other nodes, for data managed in SCSI (small computer systems interface) disks in a RAID clustered system, wherein the locking prevents other nodes from modifying the parity data;
   (b) reading the parity data;
   (c) generating new purity data by exclusive oring data from a first node and a second node;
   (d) writing the parity data to a SCSI disk in the RAID clustered system; and
   (e) unlocking the parity data, wherein commands for writing and unlocking are combined into a single command.

2. The method of claim 1, wherein the locking comprises issuing a RESERVE command.

3. The method of claim 1, wherein the unlocking comprises issuing a RELEASE command.

4. The method of claim 1, wherein the locking and reading steps are combined.

5. The method of claim 1 wherein the RAID clustered system is RAID-4.

6. The method of claim 1 wherein the RAID clustered system is RAID-5.

7. The method of claim 1 wherein the RAID clustered system is RAID-6.

8. An apparatus for updating parity data in a redundant array of independent disk (RAID) clustered environment comprising:
   (a) a plurality of SCSI (small computer systems interface) storage devices organized in a RAID clustered system;
   (b) data stored in the plurality of SCSI storage devices;
   (c) a first node, operatively coupled to the plurality of SCSI storage devices, that manages storage and retrieval of the data in the plurality of SCSI storage devices, wherein the first node is configured to:
      (i) lock parity data without communicating wit other nodes, wherein a lock prevents other nodes from modifying the parity data;
      (ii) read the parity data;
      (iii) generate new parity data by exclusive oring darn from two nodes;

(iv) write the parity data to a SCSI disk in the RAID clustered system; and (v) unlock the parity data, wherein logic for writing and unlocking are combined into a single command.

9. The apparatus of claim 8, wherein the first node locks the parity data by issuing a RESERVE command.

10. The apparatus of claim 8, wherein the first node unlocks the parity data by issuing a RELEASE command.

11. The apparatus of claim 8, wherein the first node is further configured to combine logic for locking and reading.

12. The apparatus of claim 8 wherein the RAID clustered system is RAID-4.

13. The apparatus of claim 8 wherein the RAID clustered system is RAID-5.

14. The apparatus of claim 8 wherein the RAID clustered system is RAID-6.

15. An article of manufacture, embodying logic to perform method steps of updating parity data in a redundant array of independent disk (RAID) clustered environment, the method steps comprising the steps of:

(a) locking parity data without communicating with other nodes, wherein the locking prevents other nodes from modifying the parity data;

(b) wading the parity data;

(c) generating new parity data by exclusive oring data from two nodes;

(d) writing the parity data to a SCSI (small computer systems interface) disk in the RAID clustered system; and (e) unlocking die panty data, wherein commands for writing and unlocking are combined into a single command.

16. The article of manufacture of claim 15, wherein the locking comprises issuing a RESERVE command.

17. The article of manufacture of claim 15, wherein the unlocking comprises issuing a RELEASE command.

18. The article of manufacture of claim 15, wherein the locking and reading steps are combined.

19. The article of manufacture of claim 15, wherein tho RAID clustered system is RAID-4.

20. The article of manufacture of claim 15, wherein the RAID clustered system is RAID-5.

21. The article of manufacture of claim 15 wherein the RAID clustered system is RAID-6.

* * * * *